(12) United States Patent
Liao et al.

(10) Patent No.: US 12,482,706 B2
(45) Date of Patent: Nov. 25, 2025

(54) SEMICONDUCTOR STRUCTURE THAT INCLUDES SELF-ALIGNED CONTACT PLUGS AND METHODS FOR MANUFACTURING THE SAME

(71) Applicant: Vanguard International Semiconductor Corporation, Hsinchu (TW)

(72) Inventors: Po-Hsiang Liao, New Taipei (TW); Sheng-Wei Fu, Taoyuan (TW); Chung-Yeh Lee, Xinpu Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 698 days.

(21) Appl. No.: 17/862,710

(22) Filed: Jul. 12, 2022

(65) Prior Publication Data
US 2024/0021475 A1    Jan. 18, 2024

(51) Int. Cl.
*H10D 64/01* (2025.01)
*H01L 21/768* (2006.01)
(Continued)

(52) U.S. Cl.
CPC ....... *H01L 21/76897* (2013.01); *H10D 64/01* (2025.01); *H10D 64/015* (2025.01);
(Continued)

(58) Field of Classification Search
CPC ........ H01L 21/76897; H01L 21/76805; H10D 64/01; H10D 64/015; H10D 64/021; H10D 64/258; H10D 64/513; H10D 30/0293; H10D 30/0297; H10D 30/668; H10D 64/256; H10D 62/393; H10D 30/658; H10D 64/025–027; H10D 30/0275;
(Continued)

(56) References Cited

U.S. PATENT DOCUMENTS 6,180,453 B1 *  1/2001  Sung .................... H10B 12/485
                                                    257/E21.654
6,184,081 B1 *  2/2001  Jeng .................. H01L 21/76805
                                                    438/254
(Continued)

FOREIGN PATENT DOCUMENTS

TW          201503366 A    1/2015
TW          202032790 A    9/2020

OTHER PUBLICATIONS

Taiwanese Office Action and Search Report for Taiwanese Application No. 111118635, dated Dec. 30, 2022.

*Primary Examiner* — Maliheh Malek
(74) *Attorney, Agent, or Firm* — Birch, Stewart, Kolasch & Birch, LLP

(57) ABSTRACT

A semiconductor structure includes a substrate, several gate structures formed in the substrate, dielectric portions formed on the respective gate structures, spacers adjacent to and extending along the sidewalls of the dielectric portions, source regions formed between the substrate and the spacers, and contact plugs formed between adjacent gate structures and contact the respective source regions. The source regions are adjacent to the gate structures. The sidewalls of the spacers are aligned with the sidewalls of the underlying source regions.

19 Claims, 8 Drawing Sheets

(51) Int. Cl.
*H10D 64/23* (2025.01)
*H10D 64/27* (2025.01)

(52) U.S. Cl.
CPC ......... *H10D 64/021* (2025.01); *H10D 64/258* (2025.01); *H10D 64/513* (2025.01)

(58) Field of Classification Search
CPC ............. H10D 30/6894; H10D 30/699; H10D 64/512–513
See application file for complete search history.

(56) References Cited

U.S. PATENT DOCUMENTS

| | | | | |
|---|---|---|---|---|
| 6,200,898 B1* | 3/2001 | Tu | ..................... | H01L 21/31116 257/E21.018 |
| 6,472,708 B1* | 10/2002 | Hshieh | ................ | H10D 30/668 257/908 |
| 6,479,341 B1* | 11/2002 | Lu | ..................... | H10B 12/0335 438/399 |
| 6,674,124 B2* | 1/2004 | Hshieh | ................ | H10D 30/668 438/270 |
| 7,109,552 B2* | 9/2006 | Wu | ..................... | H10D 30/668 257/330 |
| 7,211,862 B2* | 5/2007 | Nakazawa | ........... | H10D 62/393 257/E29.066 |
| 7,319,256 B1* | 1/2008 | Kraft | .................... | H10D 84/038 257/E27.06 |
| 8,110,465 B2* | 2/2012 | Zhu | .................... | H10D 30/0212 438/176 |
| 8,143,126 B2* | 3/2012 | Chen | .................... | H10D 64/518 438/270 |
| 8,580,667 B2* | 11/2013 | Lui | .................... | H10D 84/146 438/237 |
| 8,742,494 B2* | 6/2014 | Wu | .................... | H10B 12/0335 257/334 |
| 8,796,764 B2* | 8/2014 | Blank | ................ | H10D 30/0297 257/E29.257 |
| 9,397,213 B2* | 7/2016 | Qin | .................... | H10D 30/665 |
| 9,666,684 B2* | 5/2017 | Basu | ................ | H10D 30/4735 |
| 9,905,464 B2* | 2/2018 | Hung | .................... | H01L 23/535 |
| 10,020,380 B2* | 7/2018 | Li | ........................ | H10D 64/256 |
| 10,930,567 B2* | 2/2021 | Lee | .................... | H01L 21/76895 |
| 11,362,213 B2* | 6/2022 | Ju | ....................... | H10D 30/6211 |
| 2001/0010958 A1* | 8/2001 | Liaw | .................... | H10B 12/485 257/E27.086 |
| 2003/0089946 A1* | 5/2003 | Hshieh | ................ | H10D 30/668 257/338 |
| 2006/0091452 A1* | 5/2006 | Wu | .................... | H10D 30/0297 257/330 |
| 2006/0113588 A1* | 6/2006 | Wu | .................... | H10D 30/0293 257/330 |
| 2007/0075362 A1* | 4/2007 | Wu | .................... | H10D 30/0293 257/E29.155 |
| 2009/0026531 A1* | 1/2009 | Poelzl | ................. | H10D 30/665 257/E21.294 |
| 2012/0146090 A1* | 6/2012 | Lui | .................... | H10D 30/025 257/E29.198 |
| 2012/0326207 A1* | 12/2012 | Yoshimochi | ......... | H10D 62/116 257/E29.198 |
| 2014/0367773 A1* | 12/2014 | Poelzl | ................. | H10D 12/481 438/270 |
| 2015/0021662 A1* | 1/2015 | Basu | .................... | H10D 30/60 438/285 |
| 2016/0064546 A1* | 3/2016 | Zitouni | ................ | H10D 64/513 257/334 |
| 2016/0218008 A1* | 7/2016 | Li | ....................... | H01L 21/28035 |
| 2016/0284838 A1* | 9/2016 | Qin | .................... | H10D 30/668 |
| 2017/0194203 A1* | 7/2017 | Hung | ................ | H10D 84/0149 |
| 2019/0273152 A1* | 9/2019 | Yilmaz | .................... | H01L 21/3086 |
| 2020/0075417 A1* | 3/2020 | Lee | .................... | H10D 64/679 |
| 2020/0343348 A1* | 10/2020 | Jisong | ................. | H10D 64/017 |
| 2021/0280430 A1* | 9/2021 | Ke | ....................... | H10B 12/053 |
| 2021/0305428 A1* | 9/2021 | Ju | ....................... | H01L 21/76897 |
| 2022/0328658 A1* | 10/2022 | Yao | .................... | H10D 30/668 |
| 2022/0415895 A1* | 12/2022 | Jhan | .................... | H10B 12/02 |
| 2023/0035086 A1* | 2/2023 | Liaw | .................... | H10D 62/126 |
| 2023/0044856 A1* | 2/2023 | Park | .................... | H10B 12/315 |
| 2023/0260998 A1* | 8/2023 | Ju | ....................... | H01L 21/28123 257/351 |
| 2023/0290832 A1* | 9/2023 | Higuchi | ................ | H10D 12/481 |
| 2023/0377943 A1* | 11/2023 | Wu | .................... | H10D 84/0149 |

* cited by examiner

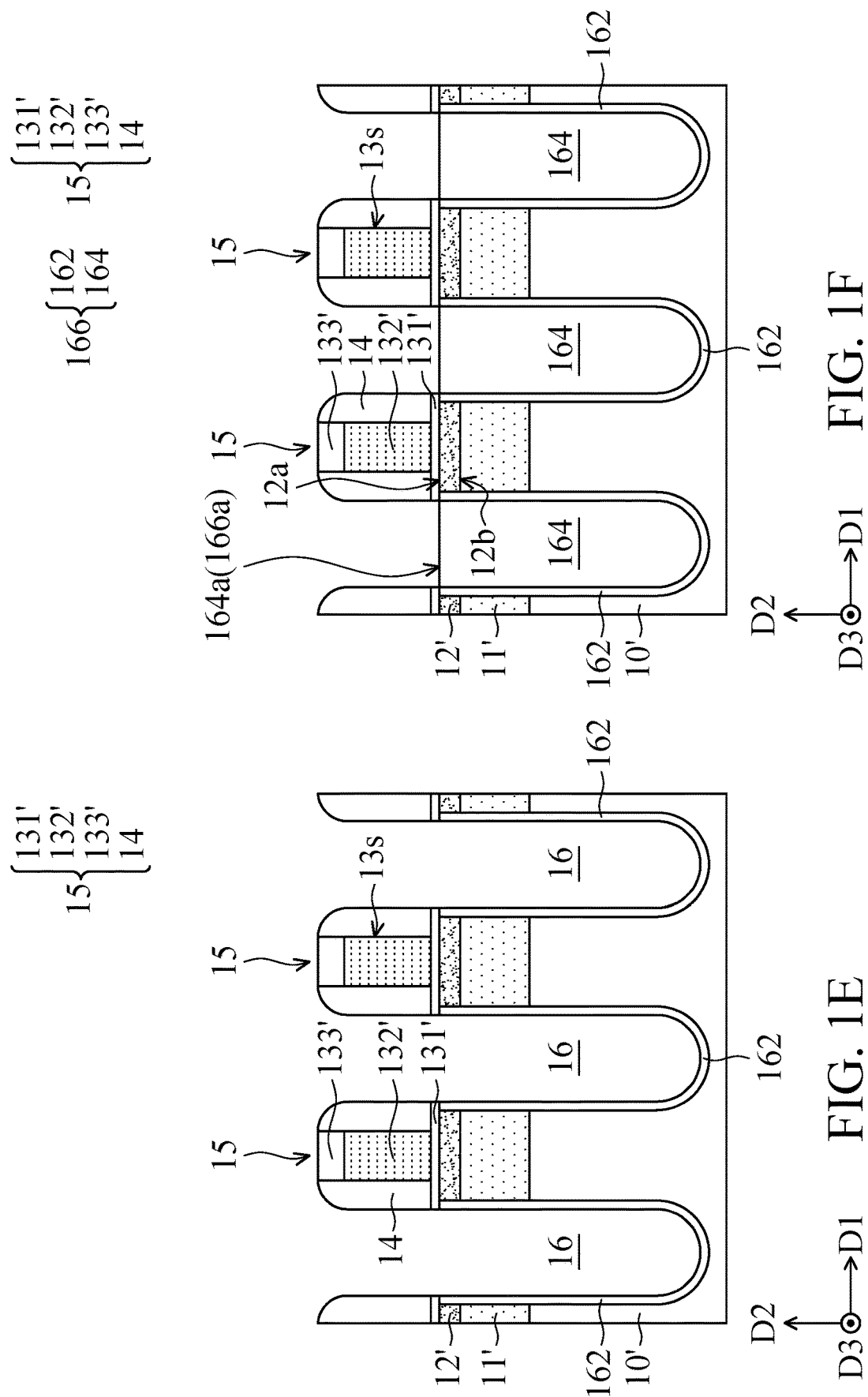

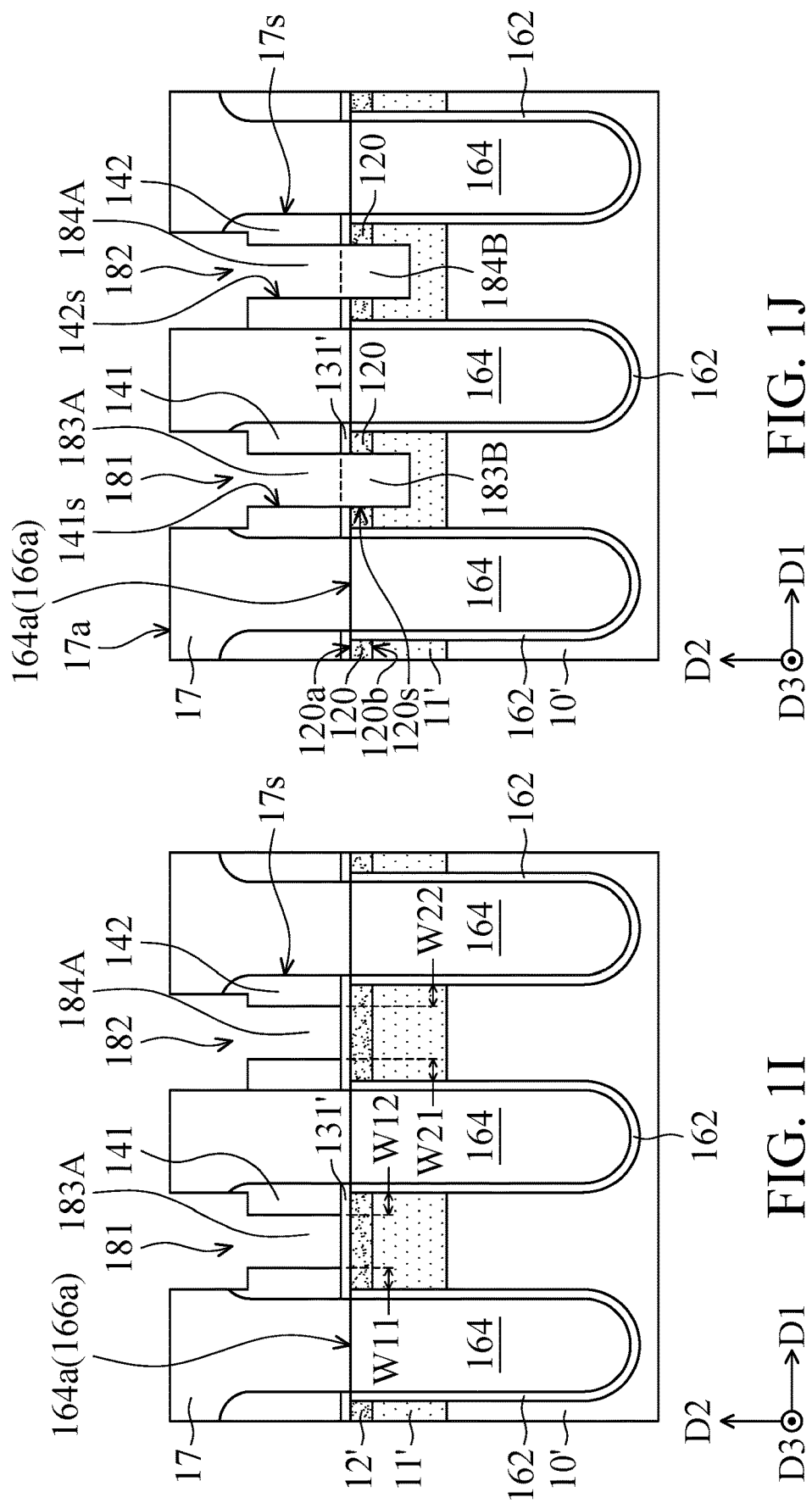

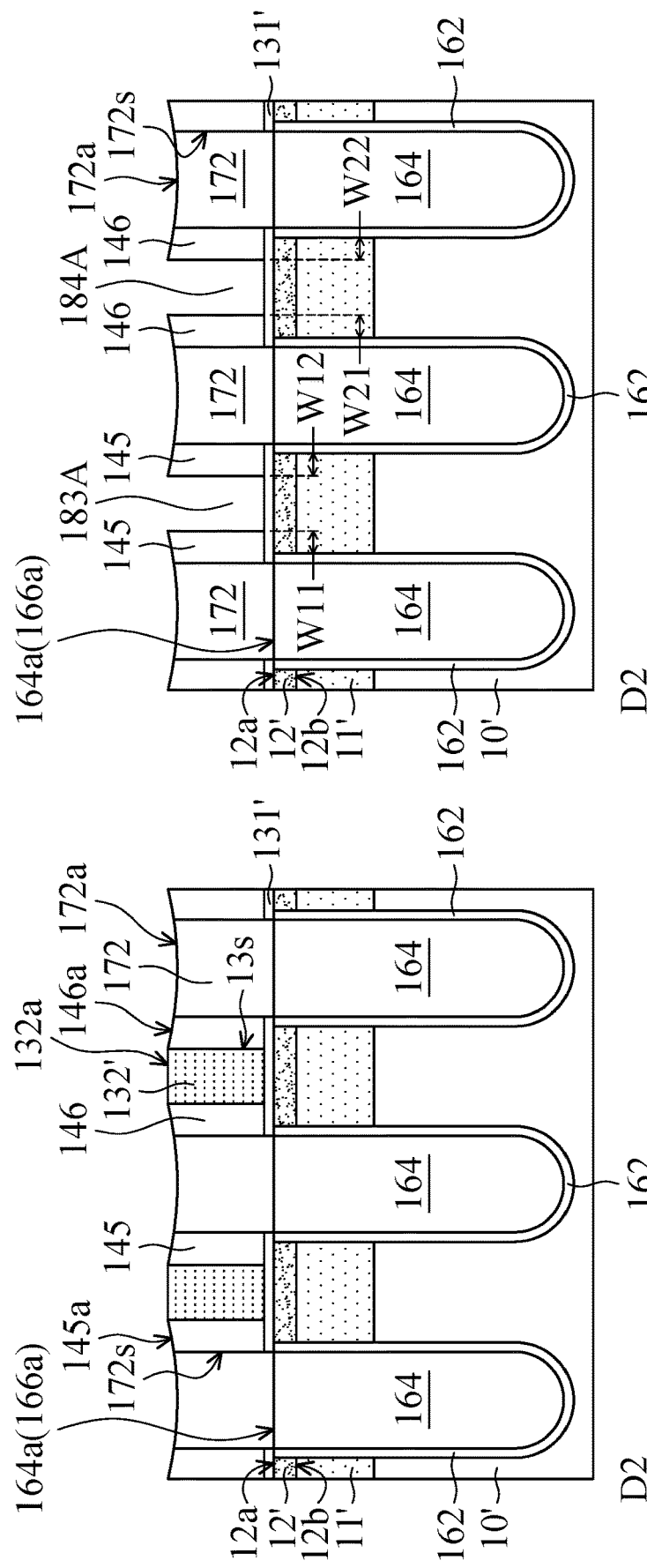

SEMICONDUCTOR STRUCTURE THAT INCLUDES SELF-ALIGNED CONTACT PLUGS AND METHODS FOR MANUFACTURING THE SAME

BACKGROUND

Technical Field

The disclosure relates to a semiconductor structure and methods for manufacturing the same, and it relates to a semiconductor structure that includes self-aligned contact plugs and methods for manufacturing the same.

Description of the Related Art

The integration density of different electronic components is being continuously improved in the semiconductor industry. Continuously decreasing the minimum size of the components allows more and more components to be integrated into a given area. For example, trench gate metal-oxide-semiconductor field effect transistors, which are widely applied in power switch components, are designed to have a vertical structure to increase their functional density. In a trench gate metal-oxide-semiconductor field effect transistor, the back side of the chip serves as a drain, while the sources and gates of various transistors are formed at the front side of the chip.

However, as the functional density of semiconductor devices continuously increases, the complexity of processing and manufacturing these semiconductor devices also increases. For example, due to the restrictions of the alignment ability of traditional lithography machines, the scaling-down process of the feature size of the trench gate metal-oxide-semiconductor field effect transistors cannot be implemented. Therefore, the on resistance of semiconductor devices cannot be decreased effectively. In addition, inaccurate overlays between the upper and lower components (known as overlay shift) may occur due to machine capability or process limitations. Overlay shift causes many problems and may lead to unstable electrical performance of the semiconductor device.

SUMMARY

Some embodiments of the present disclosure provide semiconductor structures. A semiconductor structure includes a substrate, several gate structures in the substrate and several dielectric portions on the respective gate structures. The semiconductor structure further includes several spacers adjacent to the sidewalls of the dielectric portions, and the spacers extend along the sidewalls of the dielectric portions. The semiconductor structure further includes several source regions positioned between the substrate and the spacers. The source regions are formed adjacent to the gate structures. The semiconductor structure further includes contact plugs between adjacent gate structures, and the contact plugs are in contact with the respective source regions. In addition, the sidewalls of the spacers are level with the sidewalls of the respective source regions that are under the spacers.

Some embodiments of the present disclosure provide methods for manufacturing a semiconductor structure. A method for manufacturing a semiconductor structure includes providing a substrate; forming gate structures in the substrate; and forming mask strips on the substrate, wherein the mask strips are separated from each other in the first direction. In some embodiments, the gate structures and the mask strips do not overlap in a vertical projection direction. The method for manufacturing a semiconductor structure further includes forming a spacer layer on opposite sides of each of the mask strips, wherein each of the mask strips and each of the spacer layers form a patterned mask layer. The method for manufacturing a semiconductor structure further includes forming dielectric portions to cover the gate structures and the patterned mask layers; removing the masking strips to form openings; and forming contact plugs in the openings.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein:

FIG. 1A, FIG. 1B, FIG. 1C, FIG. 1D, FIG. 1E, FIG. 1F, FIG. 1G, FIG. 1H, FIG. 1I, FIG. 1J and FIG. 1K illustrate cross-sectional views of intermediate stages of a method for manufacturing a semiconductor structure in accordance with some embodiments of the present disclosure.

FIG. 2A, FIG. 2B, FIG. 2C, FIG. 2D and FIG. 2E illustrate cross-sectional views of intermediate stages of a method for manufacturing a semiconductor structure in accordance with some embodiments of the present disclosure.

DETAILED DESCRIPTION

Figure 1B:
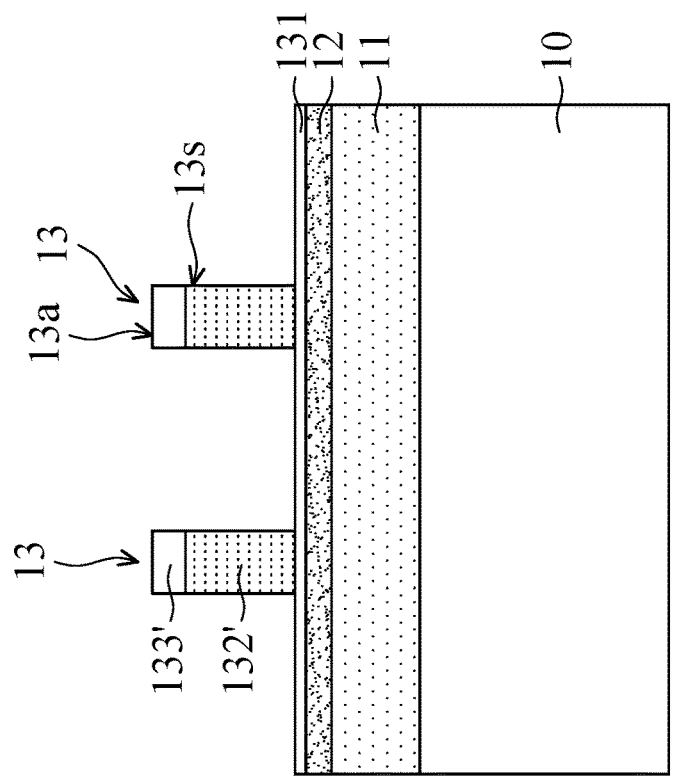

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

Embodiments provide semiconductor structures and methods for manufacturing the same. In some embodiments, a semiconductor structure with self-aligned contact plugs and self-aligned gate structures can be formed, and acceptable overlay-misaligned window can be enlarged. Accordingly, the electrical performance of the semiconductor structure is more stable, thereby improving the electronic properties and reliability of the semiconductor structure. The embodiments can be applied to metal-oxide-semiconductor (MOS) devices, such as metal-oxide-semiconductor field effect transistors (MOSFETs). In some of the embodiments described below, a trench gate MOSFET is used to illustrate a semiconductor structure. However, the present disclosure is not limited thereto. Some embodiments of the present disclosure can be applied to other types of semiconductor structures.

FIG. 1A-FIG. 1K illustrate cross-sectional views of intermediate stages of a method for manufacturing a semiconductor structure in accordance with some embodiments of the present disclosure.

Figure 1A:
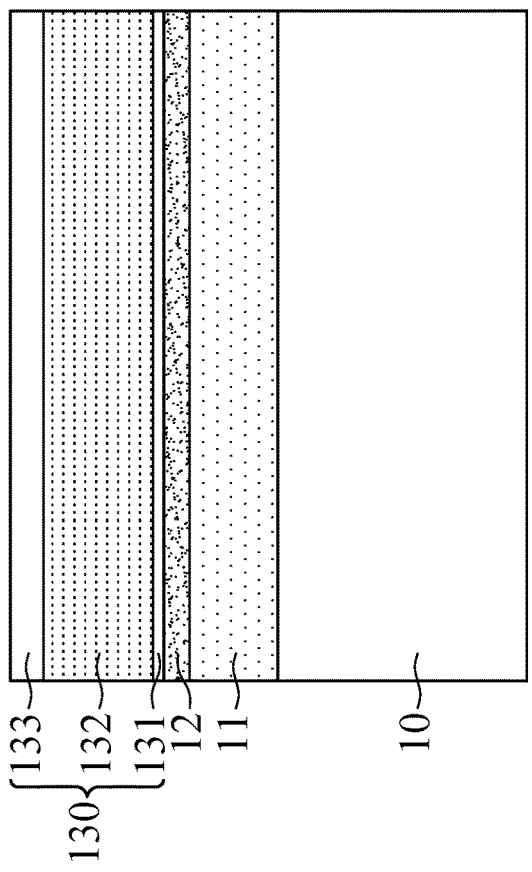

Referring to FIG. 1A, a substrate 10 is provided according to some embodiments. In some embodiments, the substrate 10 is a bulk semiconductor substrate, such as a semiconductor wafer. For example, the substrate 10 is a silicon wafer. The substrate 10 may include silicon or other elemental semiconductor materials, such as germanium (Ge). In some embodiments, the substrate 10 is a sapphire substrate, a silicon substrate, or a silicon carbide (SiC) substrate. In some embodiments, the substrate 10 may include one or more semiconductor materials, insulation materials, conductive materials, or a combination thereof. The substrate 10 may be a single-layer structure or a multilayer structure that includes one of more of the forgoing materials. For example, the substrate 10 may be formed of at least one semiconductor material selected from the group consisting of Si, Ge, SiGe, GaN, GaP, GaAs, SiC, SiGeC, InAs, and InP. In some embodiments, the substrate 10 may also include a silicon-on-insulator (SOI) layer. The SOI substrate can be formed by using an oxygen implanted isolation (SIMOX) process, a wafer bonding process, another suitable method, or a combination thereof. In some other embodiments, the substrate 10 may include multiple layers of materials, such as Si/SiGe, Si/SiC. In some other embodiments, the substrate 10 may include an insulator material, such as an organic insulator, an inorganic insulator, or a combination of the foregoing materials to form a single-layer structure or a multilayer structure. In some other embodiments, the substrate 10 may also include a conductive material, such as polysilicon, metal, alloy, or a combination of the foregoing materials to form a single-layer structure or a multilayer structure.

According to some embodiments, the first implant layer 11 and the second implant layer 12 are sequentially formed on the substrate 10. The doping concentration of the second implant layer 12 is higher than the doping concentration of the first implant layer 11. In some embodiments, the first implant layer 11 is patterned to form the body regions between the gate structures, and the second implant layer 12 is patterned to form the source regions on the body regions in the subsequent processes (described later). Therefore, the first implant layer 11 can also be referred to as a body implant layer, and the second implant layer 12 can also be referred to as a source implant layer.

In some embodiments, suitable dopants are implanted into the substrate 10. For example, dopants are implanted into the top portion of the substrate. Then, heat is then applied to activate dopant atoms and drive dopant diffusion. The conductivity type of the dopant ions is opposite to the conductivity type of the dopant in the substrate. In some embodiments, the dopant ions can be boron ions for the N-channel device. In some embodiments, the dopant ions can be phosphorus or arsenic ions for the P-channel device. In some embodiments, dopant diffusion with the first doping concentration can be performed, followed by dopant diffusion with the second doping concentration in the diffusion region. The second doping concentration is greater than the first doping concentration. Accordingly, as shown in FIG. 1, the first implant layer (such as a body implant layer) 11 and the second implant layer (such as a source implant layer) 12 are formed, respectively.

Figure 1C:
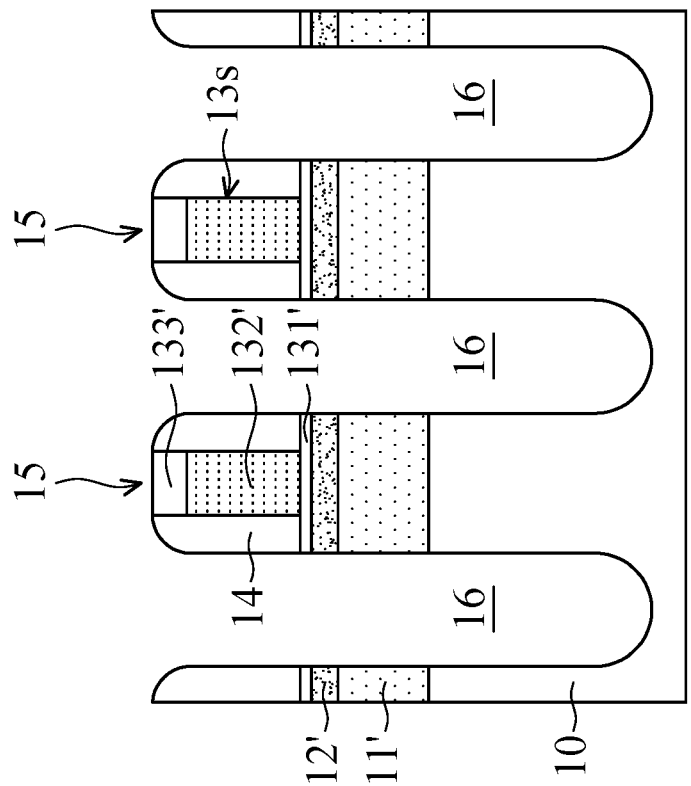
Figure 1D:
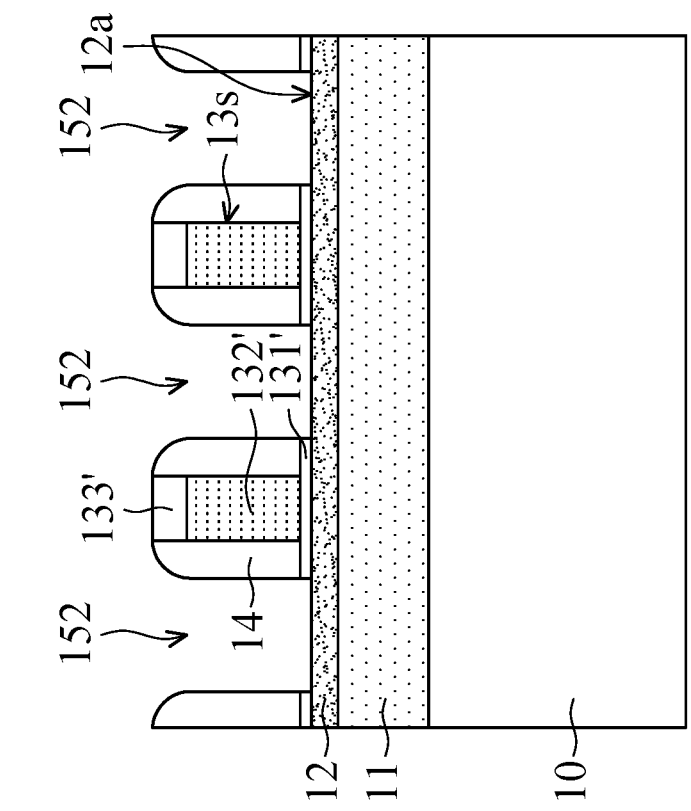

Next, in some embodiments, a patterned mask layer 15 is formed over the substrate 10 (FIG. 1C), and several gate trenches 16 are formed in the substrate 10 (FIG. 1D).

Referring to FIG. 1B, in some embodiments, a hard mask 130 is formed over the substrate 10. For example, the hard mask 130 is formed on the second implant layer (such as the source implant layer) 12. The hard mask 130 may include alternating layers of two different insulator materials. In this example, the hard mask 130 includes a first hard mask layer 131 on the second implant layer 12, a second hard mask layer 132 on the first hard mask layer 131 and a third hard mask layer 133 on the second hard mask layer 132. In one embodiment, the first hard mask layer 131 and the third hard mask layer 133 include oxide such as, but not limited to, silicon oxide, aluminum oxide, hafnium oxide, zirconium oxide, titanium oxide, or another suitable dielectric material. The second hard mask layer 132 includes nitride such as, but not limited to, silicon nitride, aluminum nitride, silicon oxynitride or another suitable dielectric materials. In this example, the hard mask 130 can also be referred to as an ONO layer.

Next, referring to FIG. 1B, in some embodiments, the hard mask 130 is patterned by a photolithography process to form a patterned hard mask. In one example, the third mask layer 133 including oxide and the second mask layer 132 including nitride are etched to form a patterned hard mask.

As shown in FIG. 1B, the patterned hard mask includes several mask strips 13, and those mask strips 13 are spaced apart from each other in the first direction D1. In this example, the material layers of each of the mask strips 13 are stacked in the second direction D2 and extend in the third direction D3. Each of the mask strips 13 includes the second patterned mask layer 132' on the first mask layer 131 and the third patterned mask layer 133' on the second patterned mask layer 132'. The positions of the mask strips 13 determine the positions of the subsequently formed contact plugs (i.e. the contact plugs 195 in FIG. 1K), in accordance with some embodiments of the present disclosure.

Next, referring to FIG. 1C, in some embodiments, spacer layers 14 are formed on the sidewalls of the mask strips 13. In one example, a method for forming the spacer layers 14 includes conformably depositing a spacer material (not shown) on the sidewalls 13s and the top surface 13a of the mask strips 13. Then, the spacer material is etched to remove the portions of the spacer material above the top surfaces 13a of the mask strips 13 to expose the third patterned mask layers 133'. The remaining portions of the spacer material are referred to as the spacer layers 14. During the etching of the spacer material, the portions of the first mask layer 131 that are outside the spacer layer 14 (i.e., the portions of the first mask layer 131 not covered by the spacer layer 14) are also removed to expose the underlying substrate. In this example, after the spacer material is etched, the top surface 12a of the second implant layer (such as the source implant layer) 12 is exposed.

In some embodiments, the spacer layers 14, the first patterned mask layer 131', the second patterned mask layers 132' and the third patterned mask layers 133' form a patterned mask layer 15. As shown in FIG. 1C, the patterned mask layer 15 includes several openings 152 that expose the top surface 12a of the second implant layer (such as the source implant layer) 12.

Referring to FIG. 1D, in some embodiments, the underlying material layers that include the second implant layer (such as the source implant layer) 12, the first implant layer (such as the body implant layer) 11 and the substrate 10 are etched through the openings 152 of the patterned mask layer 15 to form several gate trenches 16. The gate trenches 16 are, for example, separated from each other in the first direction D1 and extend downward along the second direction D2. The first direction D1 is different from the second direction D2. In this example, the first direction D1 is perpendicular to the second direction D2. Specifically, the gate trenches 16 connect the openings 152 of the patterned mask layer 15, and penetrate the second implant layer 12 and the first implant layer 11 in sequence. Also, the portions of the substrate 10 are removed by the gate trenches 16. In addition, in this example, the width of each of the openings 152 of the patterned mask layer in the first direction D1 is substantially the same as the width of each of the gate trenches 16 in the first direction D1.

Next, several gate structures (such as the gate structures 166 in FIG. 1F) are formed in the respective gate trenches 16, in accordance with some embodiments of the present disclosure. Each gate structure may include a gate dielectric layer and a gate electrode disposed on the gate dielectric layer.

Referring to FIG. 1E, in some embodiments, the gate dielectric layers 162 are formed in the respective gate trenches 16. The gate dielectric layers 162 can be formed by, for example, a chemical vapor deposition (CVD) process, an atomic layer deposition (ALD) process, a thermal oxidation process, a physical vapor deposition (PVD) process, another suitable process, or a combination of the aforementioned processes. In some embodiments, the gate dielectric layers 162 may include silicon oxide, hafnium oxide, zirconium oxide, aluminum oxide, aluminum doped hafnium dioxide, hafnium silicon dioxide, hafnium silicon oxynitride, hafnium tantalum oxide, hafnium titanium oxide, hafnium-zirconium oxide, another suitable high-k dielectric material, or a combination of the aforementioned materials.

In this embodiment, the materials of the substrate 10, the first implanted layer 11' and the second implanted layer 12' are oxidized, for example, through a thermal oxidation process, to form the gate dielectric layers 162. Accordingly, the gate dielectric layers 162 are formed on the exposed surface of the substrate 10', the exposed sidewalls of the first implant layer 11' and the exposed sidewalls of the second implant layer 12' in the gate trenches 16. In this example, the gate dielectric layers 162 can also be referred to as gate oxide layers.

Referring to FIG. 1F, the gate electrodes 164 are formed in the respective gate trenches 16, in accordance with some embodiments of the present disclosure. The gate electrodes 164 are formed on the respective gate dielectric layers 162. In some embodiments, a conductive material (not shown) can be deposited over the substrate 10 and fills the gate trenches 16. The conductive material may be in-situ doped polysilicon or undoped polysilicon. Next, the conductive material is, for example, etched back to form the gate electrodes 164. In one embodiment, the top surfaces 164a of the gate electrodes 164 are not higher than the top surface 12a of the second implant layer (such as the source implant layer) 12'. Alternatively, the top surfaces 164a of the gate electrodes 164 are level with the top surface 12a of the second implant layer 12' (as shown in FIG. 1F). However, the present invention is not limited thereto. The gate dielectric layer 162 and the gate electrode 164 in each of the gate trenches 16 are collectively referred to as a gate structure 166. In this example, the gate structures 166 are separated from each other in the first direction D1, and extend downward along the second direction D2. The first direction D1 is, for example, perpendicular to the second direction D2.

In addition, in some embodiments, the top surfaces 164a of the gate electrodes 164 are higher than the bottom surface 12b of the second implant layer 12'. Since the second implant layer 12' will form the source regions in the subsequent process, the gate electrodes 164 will be the channel controller, so as to improve the electrical performance of the semiconductor structure (for example, the threshold voltage will increase if the top surfaces 164a of the gate electrodes 164 are lower than the bottom surface 12b of the second implant layer 12' (i.e. the source region)).

Figure 1H:
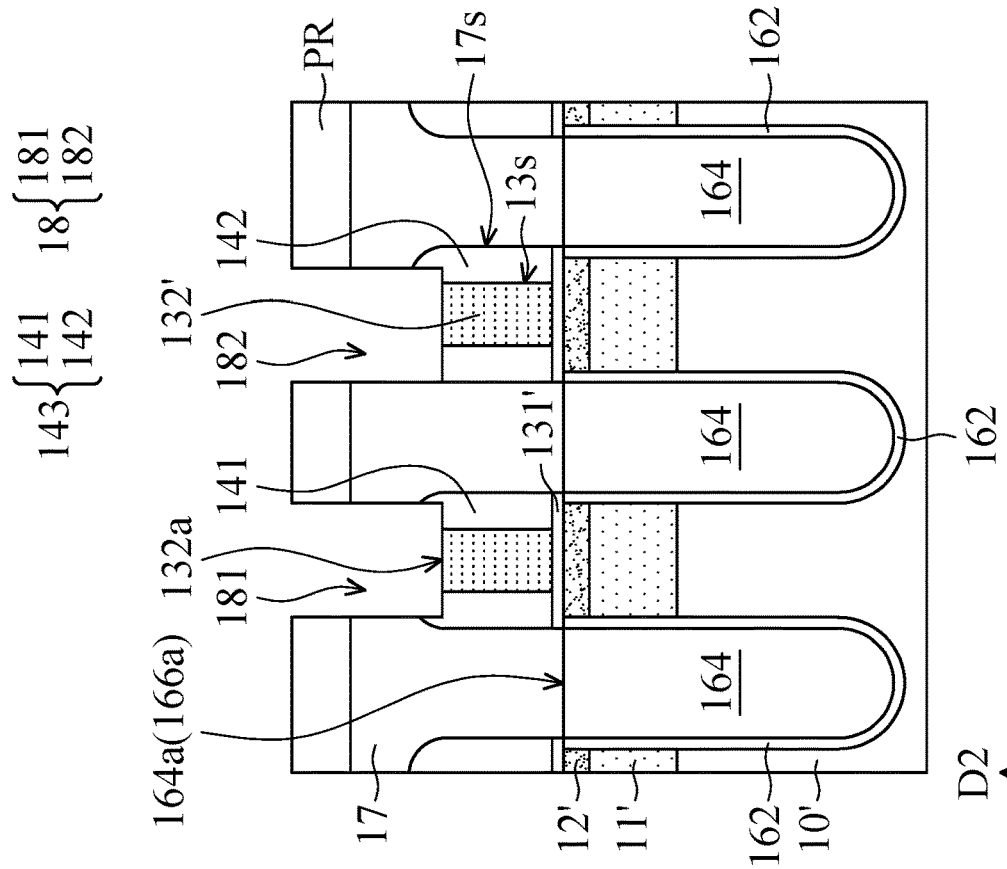
Figure 1G:
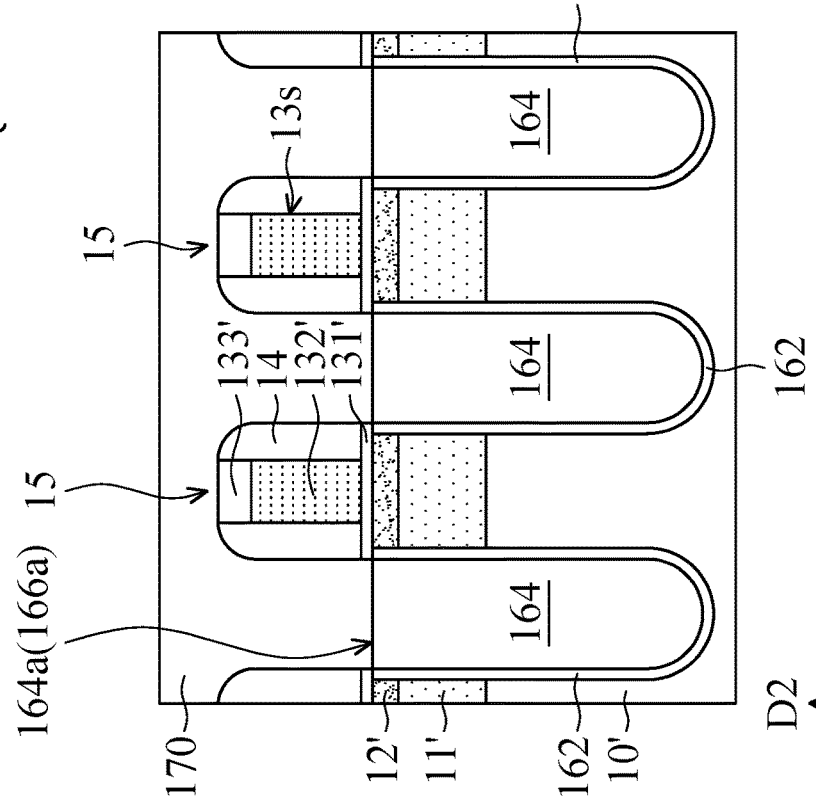

Next, referring to FIG. 1G, a dielectric material layer 170 is formed over the substrate 10', and the dielectric material layer 170 covers the gate structures 166 and the patterned mask layers 15, in accordance with some embodiments of the present disclosure. The dielectric material layer 170 may provide isolation between the active regions and subsequently formed conductive features such as contact plugs and metal lines. In some embodiments, the thickness of the dielectric material layer 170 is sufficient to cover the patterned mask layers 15 and may fill the gaps between the patterned mask layers 15 above the gate structures 166. The dielectric material layer 170 can be deposited by any suitable method, such as chemical vapor deposition (CVD), plasma enhanced chemical vapor deposition (PECVD), flowable chemical vapor deposition (FCVD), another suitable method, or a combination of the foregoing methods. The dielectric material layer 170 may include, for example, tetraethyl orthosilicate (TEOS) oxide, phospho-silicate glass (PSG), boro-silicate glass (BSG), boron-doped phospho-silicate glass (BPSG), oxides of undoped silicon glass (USG) or the like. The dielectric material layer 170 may also include another insulating material formed by any acceptable method. In addition, in some embodiments, the dielectric material layer 170 and the spacer layers 14 include the same material. In some other embodiments, the dielectric material layer 170 and the spacer layers 14 include different materials.

Next, referring to FIG. 1H, in come embodiments, portions of the dielectric material layer 170 and portions of the patterned mask layers 15 are removed to form the dielectric portions 17 on the gate structures 166 and the spacers 143 on the sidewalls 17s of the dielectric portions 17.

In some embodiments, the portions of the dielectric material layer 170 and the portions of the patterned mask layers 15 are removed by a lithography patterning process and an etching process. In some embodiments, the lithographic patterning process includes photoresist coating (e.g., spin-on coating), soft baking, mask aligning, exposure, post-exposure baking, developing the photoresist, rinsing and drying (e.g., hard baking), another suitable process, or a combination of the foregoing processes, to form a patterned photoresist layer PR on the dielectric material layer 170. After the patterned photoresist layer PR is formed, the portions of the dielectric material layer 170 and the patterned mask layers 15 that are not covered by the patterned photoresist layer PR are etched by using the patterned photoresist layer PR as a mask, in accordance with some embodiments. The etching process may include a dry etching process, a wet etching process, a plasma etching process, a reactive ion etching (RIE) process, another suitable process, or a combination of the foregoing processes. In some embodiments, the etching process stops on the top surfaces 132a of the second patterned mask layers (e.g., the nitride layer) 132', as shown in FIG. 1H. Therefore, in this example, the second patterned mask layer 132' may function as an etch stop layer in the etching process that are applied to form the dielectric portions 17 and the spacers 143.

Referring back to FIG. 1H, in some embodiments, after the portions of the dielectric material layer 170 and the portions of the patterned mask layers 15 are removed by the etching process, the remaining portions of the dielectric material layer 170 form the dielectric portions 17 on the gate structures 166. The remaining portions of the patterned mask layers 15 form the spacers 143 on the sidewalls 17s of the dielectric portions 17. In addition, after the etching process is performed completely, several openings 18 are formed between adjacent dielectric portions 17, in accordance with some embodiments of the present disclosure.

According to some embodiments of the present disclosure, the openings 18 expose the top surfaces 132a of the second patterned mask layers 132'. Specifically, the openings 18 expose the top surfaces 132a of the second patterned mask layers 132' and expose the upper portions of the sidewalls 17s of the dielectric portions 17. Two openings 18, including the first opening 181 and the second opening 182, are depicted to illustrate different situations of the openings, in accordance with some embodiments of the present disclosure. In addition, two sets of spacers, including the first set of spacers 141 and the second set of spacers 142, are depicted to illustrate the spacers 143 under the openings 18, in accordance with some embodiments of the present disclosure.

According to the alignment capability of the machine or the limitations of the processes, the overlay shift between the upper feature and the lower feature may occur during the mask alignment, exposure and development processes in the application. The first opening 181 as shown in FIG. 1H is used to represent an ideal opening, wherein a symmetrical centerline of the first opening 181 in the second direction D2 is coincident with a symmetrical centerline of the underlying second patterned mask layer 132' in the second direction D2. The second opening 182 as shown in FIG. 1H is used to represent an offset opening, wherein a symmetrical centerline of the second opening 182 in the second direction D2 is offset from a symmetrical centerline of the underlying second patterned mask layer 132' in the second direction D2.

According to some embodiments of the present disclosure, the positions of the openings 18 would be acceptable as long as the openings 18 can completely expose the top surfaces 132a of the second patterned mask layers 132', so as to facilitate subsequent processes. Therefore, as shown in FIG. 1H, whether the ideal first opening 181 or the offset second opening 182 is formed, the subsequent processes of the embodiment, including removing the second patterned mask layers 132' (FIG. 1I), formation of contact holes (FIG. 1J) and formation of self-aligned contact plugs (e.g., the contact plug 195 in FIG. 1K), can be performed through these openings.

In some embodiments, after the etching process is completed, an acceptable ashing process is performed to remove the patterned photoresist layer PR.

Referring to FIG. 1I, in some embodiments, the remaining portions of the mask strips 13 between the spacers 143 are removed to form the holes between the spacers 143. Specifically, in this exemplified embodiment, the holes 183A and 184A are formed by removing the second patterned mask layers 132' through the first opening 181 and the second opening 182, respectively. The holes 183A and 184A expose the top surface of the first patterned mask layers 131'. The second patterned mask layers 132' can be removed by a dry etching process, a wet etching process, a plasma etching process, a reactive ion etching (RIE) process, another suitable process, or a combination of the foregoing processes. In some embodiments, the second patterned mask layers 132' are removed by a wet etching process. In addition, the etchant used in the etching process selectively removes the material of the second patterned mask layers 132' without removing, or substantially removing, the materials of the dielectric portions 17 and the spacers 143.

In addition, as shown in FIG. 1I, the dielectric portions 17 are in direct contact with the underlying respective gate structures 166, in accordance with some embodiments of the present disclosure. Specifically, the top surfaces 164a of the gate electrodes 164 are completely covered by the dielectric portions 17. In some embodiments, the spacers 143 are in direct contact with the respective sidewalls 17s of the dielectric portions 17.

In some embodiments, as shown in FIG. 1I, the first opening 181 is an ideal opening and the position is not offset. After the second patterned mask layer 132' is removed through the first opening 181, the first set of spacers 141 that are formed at opposites sides of the hole 183A and on the sidewalls 17s of the dielectric portions 17 includes spacers with identical widths. That is, the width W11 is substantially the same as the width W12 (W11=W12). In addition, according to the manufacturing method of the embodiment, the second opening 182 may be formed as a slightly offset due to the limitation of the alignment capability of the machine or another process limitation factor. However, after the second patterned mask layer 132' is removed through the second opening 182, the second set of spacers 142 that are formed at opposites sides of the hole 184A and on the sidewalls 17s of the dielectric portions 17 still includes spacers with identical widths. That is, the width W21 is substantially the same as the width W22 (W21=W22).

Next, referring to FIG. 1J, in some embodiments, the material layers that are under the holes 183A and 184A are etched by using the spacers 143 (such as the first set of spacers 141 and the second set of spacers 142) and the dielectric portions 17 as an etching mask, thereby forming the self-aligned contact holes 183 and 184. As shown in FIG. 1J, the holes 183A and 184A extend to penetrate the first patterned mask layer 131' and the second implant layer 12' and removing portions of the first implant layer 11' by an etching process, in accordance with some embodiments of the present disclosure. Therefore, the holes 183B and 184B are formed below the holes 183A and 184A, respectively. The hole 183B communicates with the hole 183A, and the hole 184B communicates with the hole 184A. As shown in FIG. 1J, the holes 183A and 184A are positioned substantially between two adjacent dielectric portions 17, and the holes 183B and 184B are positioned substantially between two adjacent gate structures 166. In this example, the hole 183A and the hole 183B collectively form a contact hole 183, and the hole 184A and the hole 184B collectively form a contact hole 184.

According to some embodiments, the etching process is highly selective to the spacers 143 (such as the first set of spacers 141 and the second set of spacers 142) and the second implant layer 12', and is also highly selective to the spacers 143 and the substrate Therefore, the etching process selectively etches the second implant layer 12' and the substrate 10' without etching the spacers 143. In some embodiments, the etching process is a dry etching process, such as a reactive ion etching (RIE) process, a plasma etching process, another suitable anisotropic process, or a combination of the foregoing etching processes.

In addition, source regions 120 can be formed in the step of forming the contact holes 183 and 184, in accordance with some embodiments of the present disclosure. As shown in FIG. 1J, after the holes 183A and 184A are extended to penetrate the first patterned mask layers 131' and the second implant layer 12', the remaining portions of the second implant layer 12' form the source regions 120, in accordance with some embodiments of the present disclosure. In some embodiments, the top surfaces 164a of the gate electrodes 164 are higher than the bottom surfaces 120b of the source regions 120, but not higher than (such as lower than or level with) the top surfaces 120a of the source regions 120.

The source regions 120 are positioned between the substrate 10' and the spacers 143 (such as the first set of spacers 141 or the second set of spacers 142), in accordance with some embodiments of the present disclosure. In this example, the source regions 120 are formed by using the spacers 143 as an etching mask. Therefore, the sidewalls of the spacers 143 above the source regions 120, such as the sidewalls 141s of the first set of spacers 141 or the sidewalls 142s of the second set of spacers 142, are aligned with the sidewalls 120s of the underlying respective source regions 120.

As discussed above, in some embodiments, the spacers on opposite sides of each of the holes 183A and 184A have approximately the same width, so the source regions 120 formed on opposite sides of each of the contact holes 183 and 184 also have the same width in the first direction D1. Referring to FIG. 1I and FIG. 1J, in this example, the widths of the source regions 120 on opposite sides of the contact hole 183 are, for example, corresponding to the width W11 and the width W12 of the spacers 143. The width W11 and the width W12 are approximately the same. The widths of the source regions 120 on opposite sides of the contact hole 184 are, for example, corresponding to the width W21 and the width W22 of the spacers 143. The width W21 is substantially the same as the width W22.

Figures 1K, 2A:
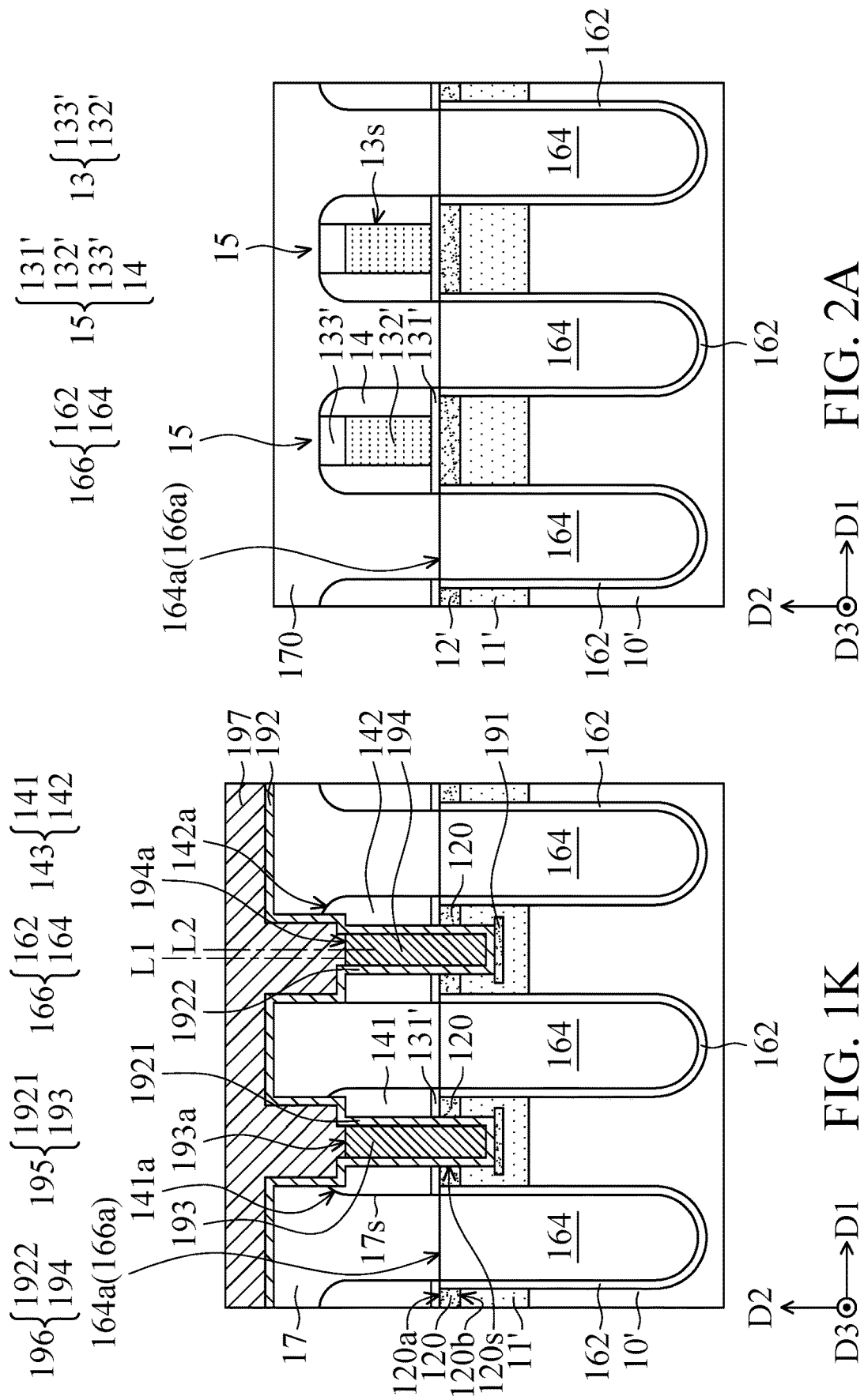

Next, referring to FIG. 1K, according to some embodiments, a contact plug 195 and a contact plug 196 are formed in the contact hole 183 and the contact hole 184, respectively. In some embodiments, a contact barrier layer 192 is conformally deposited on the structure as shown in FIG. 1J, and the contact barrier layer 192 forms a liner in each of the contact holes 183 and 184. Specifically, the contact barrier layer 192 is formed on the exposed surfaces of the dielectric portions 17 (such as the top surfaces 17a and parts of the sidewalls 17s), the exposed sidewalls of the spacers 143 (such as the sidewalls 141s and 142s), the exposed sidewalls 120s of the source regions 120 and the exposed surface of the substrate 10'.

In some embodiments, the contact barrier layer 192 includes the material of the contact barrier layer 192 includes titanium (Ti), titanium nitride (TiN), tantalum (Ta), tantalum nitride (TaN), cobalt (Co), cobalt tungsten phosphide (CoWP), ruthenium (Ru), another suitable material, or a combination of the foregoing materials. In some embodiments, the contact barrier layer 192 can be formed by using a chemical vapor deposition (CVD) process, an atomic layer deposition (ALD) process, a physical vapor deposition (PVD) process, another suitable process, or a combination of the aforementioned processes.

After the contact barrier layer 192 is formed, a conductive material (not shown) is deposited over the contact barrier layer 192, wherein the conductive material fills the first opening 181, the second opening 182, the contact holes 183 and 184. Next, the conductive material is etched back to a certain depth (for example, the top surface of the remaining conductive material is lower than the first opening 181 and the second opening 182). As shown in FIG. 1K, in this example, the conductive portion 193 that is formed by back etching the conductive material and the portion 1921 of the contact barrier layer 192 in the contact hole 183 are collectively referred to as a contact plug 195. Similarly, the conductive portion 194 that is formed by back etching the conductive material and the portion 1922 of the contact barrier layer 192 in the contact hole 184 are collectively referred to as a contact plug 196.

In addition, according to some embodiments, the uppermost surfaces of the spacers are higher than the top surfaces of the contact plugs 195 and 196. In this example, the uppermost surfaces 141a of the spacers 141 are higher than the top surface 193a of the conductive portion 193. The top surface 193a of the conductive portion 193 also serves as the top surface of the contact plug 195. The uppermost surfaces 142a of the spacers 142 are higher than the top surface 194a of the conductive portion 194. The top surface 194a of the conductive portion 194 also serves as the top surface of the contact plug 196. In addition, the top surfaces (such as the uppermost surfaces 141a and 142a) of the spacers 141 and 142 are not higher than the top surfaces 17a of the dielectric portions 17, in accordance with some embodiments of the present disclosure. For example, the top surfaces of the spacers 141 and 142 are lower than the top surfaces 17a of the dielectric portions 17.

In some embodiments, the conductive material that forms the conductive portion 193 and the conductive portion 194 may include aluminum (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicon nitride (TaSiN), tantalum carbide nitride (TaCN), titanium aluminide (TiAl), titanium aluminide nitride (TiAlN), another suitable metal, or a combination of the foregoing materials. In this example, the conductive portions 193 and 194 include tungsten. In addition, in some embodiments, the conductive material can be formed by a chemical vapor deposition (CVD) process, an atomic layer deposition (ALD) process, a physical vapor deposition (PVD) process, another suitable process, or a combination of the foregoing processes.

In some embodiments, as shown in FIG. 1K, before the contact barrier layer 192 is formed, an ion implantation process can be performed to form the contact doped regions 191 that are heavily doped in the first implant layer 11'. The doping concentration of the contact doping regions 191 is higher than the doping concentration of the first implanted layer 11'. According to some embodiments, the contact doped regions 191 are formed under the contact plugs 195 and 196 and in direct contact with the contact plugs 195 and 196, thereby reducing the on-resistance (Ron).

In addition, after the contact plugs 195, 196 are formed, a metal layer 197 is deposited over the substrate 10', in accordance with some embodiments of the present disclosure. As shown in FIG. 1K, the metal layer 197 is deposited on the contact barrier layer 192 and the contact plugs 195 and 196 for forming the subsequent interconnection. In some embodiments, the metal layer 197 can be aluminum (Al), aluminum copper (AlCu), or another suitable metal material.

According to the aforementioned descriptions, the semiconductor structure that includes self-aligned gate structures 166 and self-aligned contact plugs (such as the contact plugs 195 and 196) can be manufactured by using the method as illustrated in FIG. 1A-FIG. 1K. In some embodiments, as shown in FIG. 1H-FIG. 1K, a symmetrical centerline (not shown) of the portion of the metal layer 197 (also referred to as the metal portion) in the first opening 181 (which is an ideal opening as described above) in the second direction D2 is coincident with a symmetrical centerline (not shown) of the underlying contact plug 195 in the second direction D2. The symmetrical centerline L1 of the metal portion in the second opening 182 (which is an offset opening as described above) in the second direction D2 is offset from the symmetrical centerline L2 of the underlying contact plug 196 in the second direction D2. However, in the semiconductor structure fabricated according to the embodiment, whether the opening over the contact plug is positioned at an ideal position or an offset position for receiving the portion of the metal layer 197, the distances between opposite sidewalls of each of the contact plugs and adjacent gate structures 166 in the first direction D1 are approximately equal. In some embodiments, the distance between a sidewall of each contact plug and an adjacent gate structure 166 in the first direction D1 can be defined by the width of the source region 120 in the first direction D1, as shown in FIG. 1K. In some embodiments, the source regions 120 on opposite sides of each contact plug have the same width in the first direction D1. In other words, each contact plug of the embodiment is positioned between adjacent gate structures 166 without offset.

Accordingly, when the manufacturing method and the fabricated semiconductor structure of the embodiments are used in the MOS devices, many problems that are caused by inaccurate overlay between the upper and lower components in the conventional manufacturing method can be prevented. For example, inconsistencies in electrical properties of the semiconductor structures (such as dies) on different wafers and/or the semiconductor structures on the center and edge locations of the same wafer may occur due to the inaccurate overlay between the upper and lower components. The inconsistencies in electrical properties may lead to variations of threshold voltages, variations of on-resistances, or the unclamped inductive switching (UIS) test failure. In addition, the aforementioned inaccurate overlay may lead to the direct contact between conductive components (such as the contact plugs and the gate structures), thereby causing the problem of short circuit. The methods for manufacturing semiconductor structures that are provided in the embodiments can enlarge the acceptable overlay-misaligned window and form self-aligned contact plugs without offset. Therefore, the problems caused by the aforementioned inaccurate overlay between the upper and lower components can be prevented, thereby greatly improving the reliability of the semiconductor structure. Thus, the semiconductor structures manufactured by the methods in the embodiments have stable electrical performance and good reliability.

In addition to the above-mentioned manufacturing methods as provided in FIG. 1A-FIG. 1K, the semiconductor structures of the embodiments can be fabricated by another manufacturing method to obtain self-aligned gate trenches and self-aligned contact plugs. FIG. 2A-FIG. 2E illustrate cross-sectional views of intermediate stages of a method for manufacturing a semiconductor structure in accordance with some embodiments of the present disclosure. The features/components in FIG. 2A-FIG. 2E similar or identical to the features/components in FIG. 1A-FIG. 1K are designated with similar or the same reference numbers, and the details of those similar or the identical features/components are not repeated herein.

Referring to FIG. 2A, the structure shown in FIG. 1G is first provided. The structure includes several gate structures 166 that separate from each other in the first direction D1 and extend downward into the substrate 10' in the second direction D2. The structure includes also includes the patterned mask layers 15 (including the first patterned mask layers 131', the second patterned mask layers 132', the third patterned mask layers 133' and the spacer layers 14) that is used for defining the positions of the gate structures 166. In addition, the structure of FIG. 2A further includes the dielectric material layer 170, a first implant layer (such as a body implant layer) 11' and a second implant layer (such as a source implant layer) 12' on the substrate 10'. Details of the arrangement, materials and manufacturing methods of the components shown in FIG. 2A are essentially the same as what have been discussed referring to FIG. 1G, and are not repeated herein.

The manufacturing method provided in FIG. 1H-FIG. 1K uses a photolithography process and an etching process to remove portions of the dielectric material layer 170 and portions of the patterned mask layers 15 to expose the second patterned mask layers 132'. Different from the manufacturing method shown in FIG. 1H-FIG. 1K, the manufacturing method provided in FIG. 2A-FIG. 2E directly performs a planarization process on the dielectric material layer 170 to expose the second patterned mask layers 132'.

Referring to FIG. 2B, a planarization process is performed on the dielectric material layer 170 until the second patterned mask layers 132' are exposed, in accordance with some embodiments. In this planarization process, portions of the dielectric material layer 170 and portions of the patterned mask layers 15 are removed. After the planarization process, the remaining portions of the dielectric material layer 170 forms the dielectric portions 172 over the respective gate structures 166, and the remaining portions of the spacer layers 14 forms the spacers 145 and 146 on the sidewalls 172s of the respective dielectric portions 172. In addition, the top surfaces of the spacers 145 and 146 are substantially level with the top surfaces 172a of the dielectric portions 172, in accordance with some embodiments.

Specifically, as shown in FIG. 2B, in this example, the planarization process removes portions of the dielectric material layers 170, portions of the spacer layers 14 and the third patterned mask layers 133' to expose the second patterned mask layers 132'. Therefore, in this example, the second patterned mask layers 132' can serve as a stop layer for the planarization process. In addition, the planarization process may cause slight dishing of the top surfaces 172a of the dielectric portions 172 and the top surfaces 145a and 146a of the spacers 145 and 146. However, the planarization process has no effect on the subsequent processes for forming the self-aligned contact plugs.

In some embodiments, the planarization process may include a chemical mechanical planarization (CMP) process, a mechanical polishing process, an etching process, another suitable process, or a combination of the foregoing processes. In this exemplified embodiment, a chemical mechanical polishing process is performed to remove the portions of the dielectric material layer 170 and the portions of the patterned mask layers 15.

Next, referring to FIG. 2C, the second patterned mask layers 132' are removed to form the holes 183A and 184A, in accordance with some embodiments. The holes 183A and 184A, for example, expose the top surfaces of the first patterned mask layers 131'. The second patterned mask layers 132' can be removed by a dry etching process, a wet etching process, a plasma etching process, a reactive ion etching (RIE) process, another suitable process, or a combination of the foregoing processes. In some embodiments, a wet etching process is performed to remove the second patterned mask layers 132'. In addition, the etchant used in the wet etching process selectively etches the material of the second patterned mask layers 132' without etching, or substantially etching, the materials of the dielectric portions 172 and the spacers 145 and 146.

Details of the configurations, materials and manufacturing method of the components shown in FIG. 2C can be referred to the above-mentioned descriptions of the related contents in FIG. 1I, and are not repeated herein. In addition, compared with the manufacturing method provided in FIG. 1A-FIG. 1K, the manufacturing method provided in FIG. 2A-FIG. 2E does not form openings above the holes 183A and 184A (such as the first opening 181 and second opening 182 shown in FIG. 1H, FIG. 1I and FIG. 1J). However, according to the manufacturing method provided in FIG. 2A-FIG. 2E, similar to the manufacturing method provided in FIG. 1A-FIG. 1K, the spacers that have substantially the same width can be formed on opposite sides of each of the holes (such as the holes 183A and 184A).

Specifically, as shown in FIG. 2C, the spacers 145 on the sidewalls 172s of the dielectric portions 172 and on opposite sides of the hole 183A are spacers having substantially the same width. That is, the width W11 and the width W12 in FIG. 2C are substantially the same. The spacers 146 on the sidewalls 172s of the dielectric portions 172 and on opposite sides of the hole 184A are spacers having substantially the same width. That is, the width W21 and the width W22 in FIG. 2C are substantially the same.

Figures 2D, 2E:
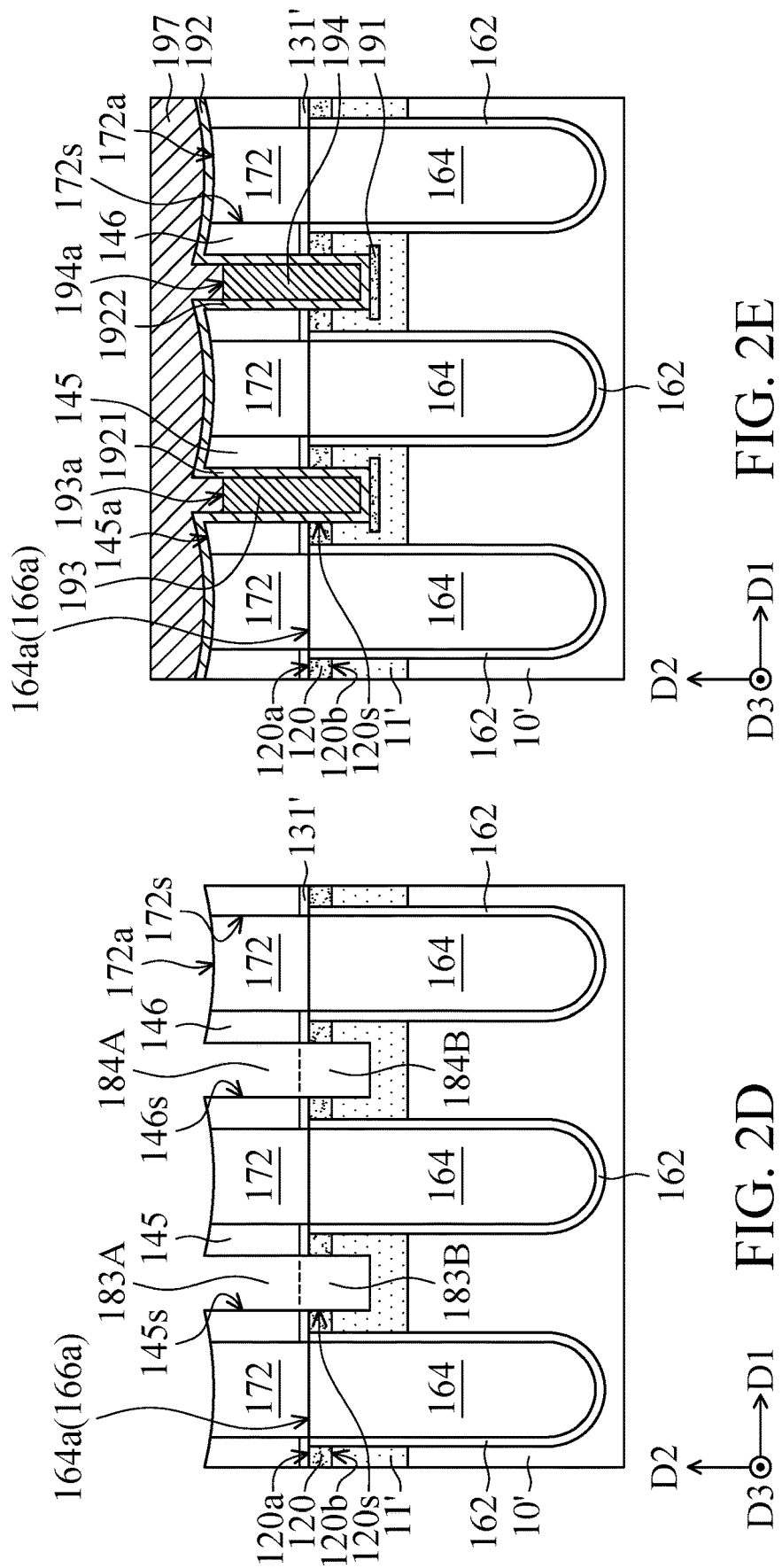

Next, referring to FIG. 2D, the spacers 145, the material layers below the holes 183A and 184A are etched by using the spacers 146 and the dielectric portions 172 as an etching mask, so as to form self-aligned contact holes 183 and 184, in accordance with some embodiments of the present disclosure. According to some embodiments, the holes 183A and 184A are extended by etching to penetrate through the first patterned mask layers 131' and the second implant layer 12', and portions of the first implant layer 11' are removed. After etching, the holes 183B and 184B are formed successively below the holes 183A and 184A, respectively. As shown in FIG. 2D, the upper holes 183A and 184A are substantially located between adjacent dielectric portions 172, and the lower holes 183B and 184B are substantially located between two adjacent gate structures 166. In this example, the hole 183A and the hole 183B collectively form a contact hole 183, and the hole 184A and the hole 184B collectively form a contact hole 184. The etching process is, for example, highly selective to the spacers 145, 146 and the second implant layer 12', and highly selective to the spacers 145, 146 and the substrate 10', thereby selectively etching the second implant layer 12' and the substrate 10' without etching, or substantially etching, the spacers 145 and 146.

Details of the configurations, materials and manufacturing method of the components shown in FIG. 2D can be referred to the above-mentioned descriptions of the related contents in FIG. 1J, and are not repeated herein.

In addition, the source regions 120 can be formed in the step of forming the contact holes 183 and 184, in accordance with some embodiments of the present disclosure. The contact holes 183 and 184 expose the sidewalls 120s of the source regions 120. As shown in FIG. 2D, after the holes 183A and 184A are extended to penetrate the first patterned mask layers 131' and the second implant layer 12', the remaining portions of the second implant layer 12' form the source regions 120, in accordance with some embodiments of the present disclosure. According to some embodiments, the source regions 120 are positioned between the substrate 10' and the corresponding spacers such as the spacers 145 and 146.

In this example, since the source regions 120 are formed by using the spacers 145 and 146 as an etching mask, the sidewalls 145s of the spacers 145 and the sidewalls 146s of the spacers 146 are level with (aligned with) the sidewall 120s of the underlying source regions 120. In addition, the spacers on opposite sides of the holes 183A and 184A have substantially the same width, the source regions 120 on opposite sides of each of the contact holes 183 and 184 also have the same width in the first direction D1, in accordance with some embodiments of the present disclosure.

Next, referring to FIG. 2E, the contact plugs 195 and 196 are respectively formed in the contact holes 183 and 184, in accordance with some embodiments. In this example, the conductive portion 193 in the contact hole 183 and the portion 1921 of the contact barrier layer 192 in the contact hole 183 are collectively referred to as the contact plug 195. The conductive portion 194 in the contact hole 184 and the portion 1922 of the contact barrier layer 192 in the contact hole 184 are collectively referred to as the contact plug 196. Details of the configurations, materials and manufacturing method of the contact barrier layer 192, the conductive portion 193 and the conductive portion 194 can be referred to the above-mentioned descriptions of the related contents in FIG. 1K, and are not repeated herein.

In some embodiments, before the contact barrier layer 192 is formed, an ion implantation process can be performed to form the contact doped regions 191 that are heavily doped in the first implant layer 11'. As shown in FIG. 2E, the contact doped regions 191 are formed under the contact plugs 195 and 196 and in direct contact with the contact plugs 195 and 196, thereby reducing the on-resistance (Ron).

In addition, after the contact plugs 195 and 196 are formed, a metal layer 197 is deposited over the substrate 10', in accordance with some embodiments of the present disclosure. As shown in FIG. 2E, the metal layer 197 is deposited on the contact barrier layer 192 and the contact plugs 195 and 196 for forming the subsequent interconnection. In some embodiments, the metal layer 197 can be aluminum (Al), alloy including aluminum and copper (AlCu), or another suitable metal material.

According to the aforementioned descriptions, the semiconductor structure that includes self-aligned contact plugs (such as the contact plugs 195 and 196) is provided, in accordance with some embodiments of the present disclosure. The semiconductor structure can be manufactured by using the method as illustrated in FIG. 1A-FIG. 1K, the method as illustrated in FIG. 2A-FIG. 2E, or another suitable method. The distances between the self-aligned contact plug and the gate structures (such as the self-aligned gate structures 166) on opposite sides of the contact plug are equal, thereby enlarging the acceptable process window of the overlay shift. Accordingly, the electrical performance of the semiconductor structure is more stable, thereby improving the electronic properties and reliability of the semiconductor structure. When the manufacturing method and the fabricated semiconductor structure of the embodiments are used in the trench gate MOS devices, especially the MOS devices having trench gates with small pitches, the defects of inaccurate overlay between the upper and lower components that are formed by using the conventional manufacturing method can be prevented. Therefore, the problems caused by the inaccurate overlay can be solved. For example, the semiconductor structure and methods for manufacturing the same, in accordance with some embodiments of the present disclosure, can prevent inconsistencies in electrical properties, such as inconsistencies in threshold voltages, inconsistencies in on-resistance and the unclamped inductive switching (UIS) test failure, of the semiconductor structures (such as dies) on different wafers and/or the semiconductor structures on the center and edge locations of the same wafer. In addition, the semiconductor structure and methods for manufacturing the same, in accordance with some embodiments of the present disclosure, can solve the problem of poor reliability of the semiconductor structure, which may be caused by the direct contact between conductive components (such as the contact plugs and the gate structures). Therefore, when the manufacturing method and the fabricated semiconductor structure of the embodiments are used in the trench gate MOS device, especially the MOS device having trench gates with small pitches, the electric properties and reliability of the MOS device can be greatly improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   gate structures in the substrate;
   dielectric portions on the respective gate structures;
   spacers adjacent to sidewalls of the dielectric portions and extending along the sidewalls of the dielectric portions;
   source regions between the substrate and the spacers, wherein the source regions are adjacent to the gate structures;
   contact plugs between the adjacent gate structures and in contact with the respective source regions; and
   a metal portion is formed on each of the contact plugs, and the metal portions are positioned between the adjacent dielectric portions, wherein the metal portions are offset from the respective contact plugs;
   wherein sidewalls of the spacers are level with sidewalls of the respective source regions that are under the spacers.

2. The semiconductor structure as claimed in claim 1, wherein the dielectric portions are in direct contact with the respective gate structures.

3. The semiconductor structure as claimed in claim 1, wherein the spacers are in direct contact with the sidewalls of the respective dielectric portions, and top surfaces of the spacers are not higher than top surfaces of the dielectric portions.

4. The semiconductor structure as claimed in claim 1, wherein top surfaces of the gate structures are not higher than top surfaces of the source regions or higher than bottom surfaces of the source regions.

5. The semiconductor structure as claimed in claim 1, wherein a distance between a sidewall of each of the contact plugs and one of the gate structures adjacent to the sidewall of the contact plug is equal to a distance between an opposite sidewall of the contact plug and another gate structure adjacent to the opposite sidewall of the contact plug.

6. The semiconductor structure as claimed in claim 1, wherein the gate structures are separated from each other in a first direction, and the source regions that are in contact with opposite sides of each of the contact plugs have the same width in the first direction.

7. The semiconductor structure as claimed in claim 1, wherein an uppermost surface of the spacers is higher than top surfaces of the contact plugs.

8. The semiconductor structure as claimed in claim 1, further comprising an implant layer, wherein the source regions are positioned on the implant layer, and the contact plugs extend into the implant layer.

9. A method for manufacturing the semiconductor structure of claim 1, comprising:
   providing the substrate;
   forming the gate structures in the substrate;
   forming mask strips on the substrate, wherein the mask strips are separated from each other in a first direction, and the gate structures and the mask strips do not overlap in a vertical projection direction;
   forming a spacer layer on opposite sides of each of the mask strips, wherein each of the mask strips and each of the spacer layers form a patterned mask layer;
   forming the dielectric portions to cover the gate structures and the patterned mask layers;
   removing the masking strips to form openings;
   forming the contact plugs in the openings.

10. The method for manufacturing a semiconductor structure as claimed in claim 9, wherein forming gate structures in the substrate comprises:
    forming gate trenches in the substrate;
    depositing a conductive material over the substrate and filling the gate trenches; and
    etching back the conductive material to form the gate structures in the gate trenches;
    wherein top surfaces of the gate structures are higher than bottom surfaces of the source regions, but are not higher than top surfaces of the source regions.

11. The method for manufacturing a semiconductor structure as claimed in claim 10, wherein before the gate structures are formed, the method further comprises:
    forming a first implant layer on the substrate; and
    forming a second implant layer on the first implant layer, wherein a doping concentration of the second implant layer is higher than a doping concentration of the first implant layer;
    wherein the gate trenches penetrate through the second implant layer and the first implant layer and extend into the substrate.

12. The method for manufacturing a semiconductor structure as claimed in claim 11, wherein forming the mask strips comprises:
sequentially forming a first mask layer, a second mask layer and a third mask layer on the substrate; and
patterning the first mask layer, the second mask layer and the third mask layer to form the mask strips.

13. The method for manufacturing a semiconductor structure as claimed in claim 12, wherein forming the gate structures comprises:
etching the second implant layer, the first implant layer and the substrate by using the patterned mask layers as an etching mask to form the gate trenches.

14. The method for manufacturing a semiconductor structure as claimed in claim 13, wherein forming the dielectric portions over the gate structures comprises:
forming a dielectric material layer over the gate structures and the patterned mask layers; and
removing portions of the dielectric material layer and portions of the patterned mask layers;
wherein remaining portions of the dielectric material layer are the dielectric portions on the gate structures, and remaining portions of the spacer layers form the spacers on the sidewalls of the dielectric portions.

15. The method for manufacturing a semiconductor structure as claimed in claim 14, wherein forming contact plugs comprises:
removing remaining portions of the mask strips between the spacers, thereby forming holes between the spacers;
extending the holes to penetrate the second implant layer and remove portions of the first implant layer to form contact holes, wherein remaining portions of the second implant layer form the source regions, the contact holes expose sidewalls of the source regions; and
filling the contact holes with another conductive material to form the contact plugs.

16. The method for manufacturing a semiconductor structure as claimed in claim 9, wherein the dielectric portions are in direct contact with the respective gate structures.

17. The method for manufacturing a semiconductor structure as claimed in claim 9, wherein the spacers are in direct contact with the sidewalls of the respective dielectric portions, and top surfaces of the spacers are not higher than top surfaces of the dielectric portions.

18. The method for manufacturing a semiconductor structure as claimed in claim 9, wherein a first distance is determined between a sidewall of each of the contact plugs and one of the gate structures adjacent to the sidewall of each of the contact plugs, and a second distance is determined between an opposite sidewall of each of the contact plugs and another gate structure adjacent to the opposite sidewall of each of the contact plugs, wherein the first distance is equal to the second distance.

19. The method for manufacturing a semiconductor structure as claimed in claim 9, wherein the gate structures are separated from each other in the first direction, and source regions that are in contact with opposite sides of each of the contact plugs have the same width in the first direction.

* * * * *